(12) United States Patent
Matsubara (10) Patent No.: US 11,689,187 B2
(45) Date of Patent: Jun. 27, 2023

(54) MULTIPLEXER AND COMMUNICATION APPARATUS

(71) Applicant: Murata Manufacturing Co., Ltd., Kyoto (JP)

(72) Inventor: Hiroshi Matsubara, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 11 days.

(21) Appl. No.: 16/920,834

(22) Filed: Jul. 6, 2020

(65) Prior Publication Data

US 2020/0336132 A1 Oct. 22, 2020

Related U.S. Application Data

(63) Continuation of application No. PCT/JP2018/046179, filed on Dec. 14, 2018.

(30) Foreign Application Priority Data

Jan. 10, 2018 (JP) .................................. 2018-001747

(51) Int. Cl.
*H03H 9/64* (2006.01)
*H03H 7/38* (2006.01)
*H03H 9/72* (2006.01)

(52) U.S. Cl.
CPC ............ *H03H 9/6483* (2013.01); *H03H 7/38* (2013.01); *H03H 9/72* (2013.01)

(58) Field of Classification Search
CPC ........... H03H 7/38; H03H 9/6483; H03H 9/72
See application file for complete search history.

(56) References Cited

U.S. PATENT DOCUMENTS

2003/0169129 A1 9/2003 Takamine
2004/0227585 A1 11/2004 Taniguchi et al.
(Continued)

FOREIGN PATENT DOCUMENTS

JP 2003289234 A 10/2003
JP 2006211057 A 8/2006
(Continued)

OTHER PUBLICATIONS

International Search Report issued in Application No. PCT/JP2018/046179, dated Feb. 26, 2019.
(Continued)

*Primary Examiner* — Samuel S Outten
(74) *Attorney, Agent, or Firm* — Pearne & Gordon LLP (57) ABSTRACT

A multiplexer includes a first matching circuit having one end connected to a common terminal; a first filter that has one end connected to the other end of the first matching circuit and the other end connected to a first terminal; a second matching circuit having one end connected to the common terminal; a second filter that has one end connected to the other end of the second matching circuit and the other end connected to a second terminal; and a third filter that has one end connected to the common terminal and the other end connected to a third terminal. The first matching circuit includes a first inductor connected on a first signal path in the first matching circuit. The second matching circuit includes a second inductor connected between a second signal path in the second matching circuit and ground.

21 Claims, 7 Drawing Sheets

(56) References Cited

U.S. PATENT DOCUMENTS

| | | | | |
|---|---|---|---|---|
| 2010/0091752 A1* | 4/2010 | Kemmochi | ............ | H03H 7/463 |
| | | | | 370/339 |
| 2010/0109801 A1 | 5/2010 | Inoue et al. | | |
| 2012/0112850 A1* | 5/2012 | Kim | ......................... | H03H 7/38 |
| | | | | 333/32 |
| 2016/0380608 A1* | 12/2016 | Ni | ....................... | H04B 1/0057 |
| | | | | 333/133 |
| 2017/0093374 A1* | 3/2017 | Yatsenko | ............... | H03H 9/706 |
| 2017/0093554 A1 | 3/2017 | Ebihara et al. | | |
| 2017/0257078 A1* | 9/2017 | Leipold | .................. | H03H 9/605 |
| 2019/0123771 A1* | 4/2019 | Takeuchi | ............... | H03H 7/463 |
| 2020/0021274 A1* | 1/2020 | Wagner | .................. | H03H 9/545 |
| 2020/0083865 A1 | 3/2020 | Mori | | |

FOREIGN PATENT DOCUMENTS

| | | | |
|---|---|---|---|
| JP | 2008010995 A | 1/2008 | |
| JP | 2010109894 A | 5/2010 | |
| JP | 2011211347 A | 10/2011 | |
| JP | 2017063316 A | 3/2017 | |
| WO | 2004102798 A1 | 11/2004 | |
| WO | 2008075691 A1 | 6/2008 | |
| WO | 2018212048 A1 | 11/2018 | |

OTHER PUBLICATIONS

Written Opinion issued in Application No. PCT/JP2018/046179, dated Feb. 26, 2019.

\* cited by examiner

MULTIPLEXER AND COMMUNICATION APPARATUS

This is a continuation of International Application No. PCT/JP2018/046179 filed on Dec. 14, 2018 which claims priority from Japanese Patent Application No. 2018-001747 filed on Jan. 10, 2018. The contents of these applications are incorporated herein by reference in their entireties.

BACKGROUND OF THE DISCLOSURE

1. Field of the Disclosure

The present disclosure relates to a multiplexer and a communication apparatus.

2. Description of the Related Art

Multiband technologies supporting multiple frequency bands and multimode technologies supporting multiple radio systems have been developed in portable terminal devices in recent years. In such a portable terminal device, a multiplexer that demultiplexes radio-frequency signals in multiple radio carrier frequencies is arranged immediately below one antenna.

The multiplexer is capable of being composed using an acoustic-wave filter characterized by low loss in a pass band and steep bandpass characteristics near the pass band (for example, refer to Japanese Unexamined Patent Application Publication No. 2003-289234).

Figure 1:
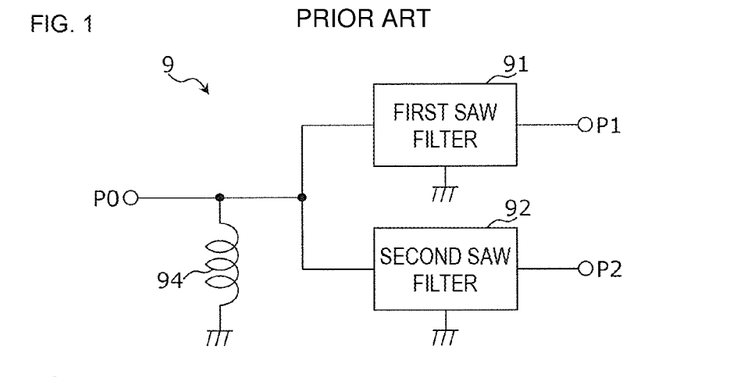
FIG. 1 is a functional block diagram illustrating an example of the configuration of a diplexer in related art.

FIG. 1 is a functional block diagram illustrating an example of a diplexer disclosed in Japanese Unexamined Patent Application Publication No. 2003-289234. As illustrated in FIG. 1, a diplexer 9 has terminals P0, P1, and P2, filters 91 and 92, and an inductance element 94. The filters 91 and 92 are surface acoustic wave (SAW) filters. The inductance element 94 is connected between a node to a node between input terminals of the filters 91 and 92 and the terminal P0 and ground potential for impedance matching.

A triplexer can be composed by connecting an additional filter having, for example, a pass band higher than the pass bands of the two SAW filters 91 and 92 to the diplexer 9 in Japanese Unexamined Patent Application Publication No. 2003-289234. However, good bandpass characteristics may not be achieved by simply adding the filter.

BRIEF SUMMARY OF THE DISCLOSURE

Accordingly, it is an object of the present disclosure to provide a multiplexer that is capable of demultiplexing and multiplexing three or more signals and that has excellent bandpass characteristics.

In order to achieve the above object, a multiplexer according to an embodiment of the present disclosure includes a common terminal; a first terminal; a second terminal; a third terminal; a first matching circuit having a first end connected to the common terminal; a first filter that has a first end connected to a second end of the first matching circuit and a second end connected to the first terminal and that has a first pass band; a second matching circuit having a first end connected to the common terminal; a second filter that has a first end connected to a second end of the second matching circuit and a second end connected to the second terminal and that has a second pass band a low pass end of which is higher than a high pass end of the first pass band; and a third filter that has a first end connected to the common terminal and a second end connected to the third terminal and that has a third pass band a low pass end of which is higher than a high pass end of the second pass band. The first matching circuit includes a first inductor connected on a first signal path connecting the first end of the first matching circuit to the second end thereof. The second matching circuit includes a second inductor connected between a second signal path connecting the first end of the second matching circuit to the second end thereof and ground.

With the multiplexer according to the present disclosure, the impedance matching of the first filter, which has the first pass band apart from the third pass band of the third filter at the low pass side, among the first filter and the second filter, is achieved by the first inductor. The first inductor is a so-called series inductor that is connected on the first signal path connecting the input-output terminals of the first matching circuit and that composes part of the first signal path. Accordingly, leakage of the signal at the high pass side of the pass band of the third filter into the first filter is inhibited by the first inductor to enable insertion loss at the high pass side of the pass band of the third filter to be suppressed. Consequently, it is possible to realize the multiplexer having excellent bandpass characteristics. In addition, it is possible to realize a high-performance communication apparatus using the multiplexer.

Other features, elements, characteristics, and advantages of the present disclosure will become more apparent from the following detailed description of preferred embodiments of the present disclosure with reference to the attached drawings.

DETAILED DESCRIPTION OF THE DISCLOSURE

Underlying Knowledge

The inventors have considered degradation of bandpass characteristics occurring in the above-mentioned triplexer having a simple configuration in the following manner.

Figure 2:
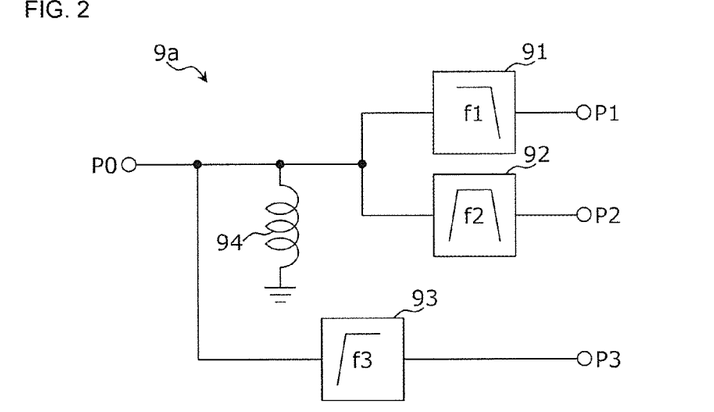
FIG. 2 is a functional block diagram illustrating an example of the configuration of a triplexer that is conceived by the inventors.

FIG. 2 is a functional block diagram illustrating an example of the configuration of a triplexer 9a conceived by the inventors. The triplexer 9a is configured by connecting an additional filter 93 to the common terminal P0 of the diplexer 9 illustrated in FIG. 1. The filters 91 and 92 are acoustic wave filters.

As for pass bands f1, f2, and f3 of the filters 91, 92, and 93, respectively, the pass band f1 of the filter 91 is at the lowest side, the pass band f2 of the filter 92 is at the high pass side of the pass band f1, and the pass band f3 of the filter 93 is at the high pass side of the pass band f2.

Here, "the pass band of a filter A is at the high pass side of the pass band of a filter B" may mean that the frequency of the low pass end of the pass band of the filter A is higher than the frequency of the high pass end of the pass band of the filter B. The high pass end and the low pass end of the pass band are typically represented by a cutoff frequency at the high pass side and a cutoff frequency at the low pass side of the pass band, respectively. The steepness at the high pass end or the low pass end of the pass band may mean the steepness of a slope of a characteristic curve in a frequency band in which the pass band makes a transition to a stop band.

Figure 3:
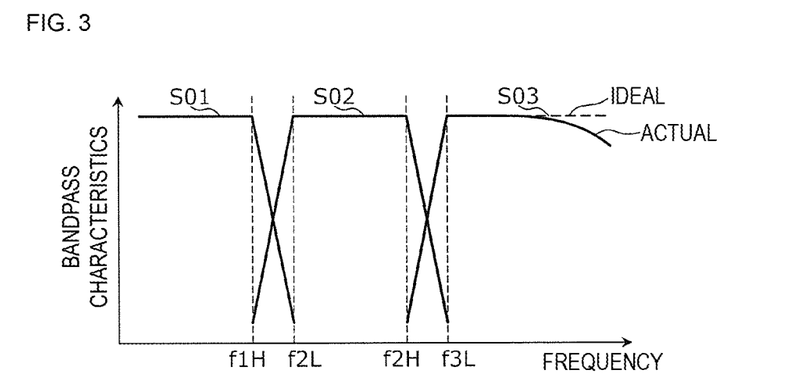
FIG. 3 is a schematic view illustrating an example of bandpass characteristics of the triplexer shown in FIG. 2.

FIG. 3 is a schematic view illustrating an example of the bandpass characteristics of the triplexer 9a. Referring to FIG. 3, a characteristic S01 represents the bandpass characteristic from the terminal P0 to the terminal P1, a characteristic S02 represents the bandpass characteristic from the terminal P0 to the terminal P2, and a characteristic S03 represents the bandpass characteristic from the terminal P0 to a terminal P3. A broken line and a solid line of the characteristic S03 represent a characteristic that is expected and a characteristic that is achieved, respectively. The characteristics S01, S02, and S03 may be indicated as the bandpass characteristics of the filters 91, 92, and 93, respectively, for convenience.

As illustrated in FIG. 3, the bandpass characteristic S03 of the filter 93 is degraded at the high pass side. Since the impedances of the filters 91 and 92, which are the acoustic wave filters, are capacitive outside the pass band, the impedances of the filters 91 and 92 are nearly short-circuited for signals having high frequencies. Accordingly, it is considered that the signal at the high pass side of the pass band of the filter 93 leaks into the filters 91 and 92 to cause the degradation described above.

The signal components in a wider frequency range included in the pass band of the filter 93 are prone to leak into the filters 91 and 92 as the filter 93 has a wider pass band and as the pass band of the filter 93 is more apart from the pass bands of the filters 91 and 92. Accordingly, the influence of the filters 91 and 92 on the filter 93 is increased.

In order to resolve this problem, achieving impedance matching between the filters 91 and 92 not with a shunt inductor but with a series inductor will now be considered. Here, the series means arrangement of elements that are connected on a signal path connecting the input-output terminals and that compose part of the signal path. The shunt means arrangement of elements connected between the signal path connecting the input-output terminals and reference potential (for example, ground).

Figure 4:
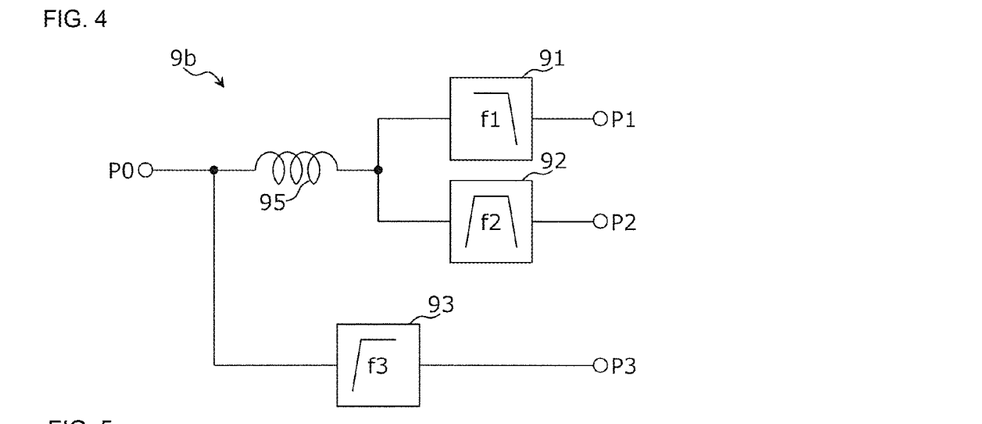
FIG. 4 is a functional block diagram illustrating an example of the configuration of a triplexer that is conceived by the inventors.

FIG. 4 is a functional block diagram illustrating an example of the configuration of a triplexer 9b. The triplexer 9b is configured by replacing the inductance element 94 in the triplexer 9a in FIG. 2 with an inductance element 95.

Figure 5:
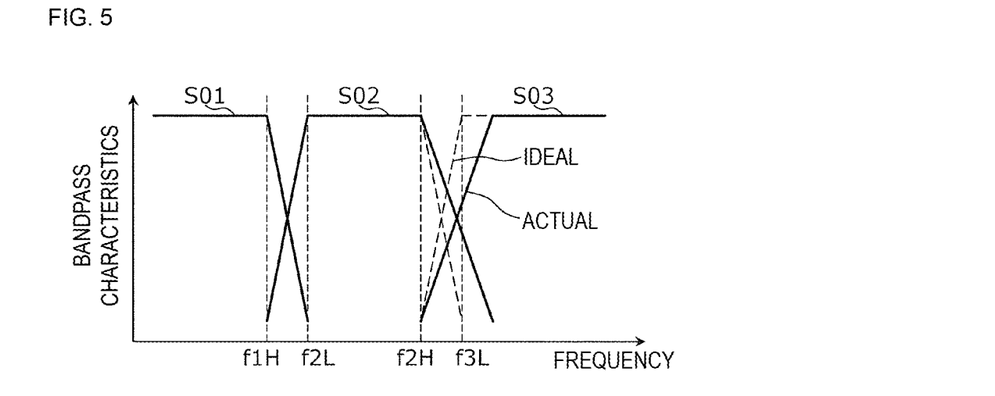
FIG. 5 is a schematic view illustrating an example of the bandpass characteristics of the triplexer shown in FIG. 4.

FIG. 5 is a schematic view illustrating an example of the bandpass characteristics of the triplexer 9b. In the example in FIG. 5, the bandpass characteristics of the filters 91, 92, and 93 in the triplexer 9b are represented in the same notation as in FIG. 3.

As illustrated in FIG. 5, the degradation at the high pass side of the bandpass characteristic S03 of the filter 93 is improved in the triplexer 9b. It is considered that this is because the leakage of the signal at the high pass side of the pass band of the filter 93 into the filters 91 and 92 is inhibited by the inductance element 95.

In contrast, the bandpass characteristic S02 of the filter 92 (more specifically, the steepness at the high pass end of the pass band) is degraded. This is because the capacitance components of the inductance element 95, which is the series inductor, and the filters 91 and 92, which are the SAW filters, function as an LC low pass filter. Since the LC low pass filter is degraded in the steepness at the end of the pass band at the high pass side of the bandpass characteristic, compared with the SAW filter, it is considered that the bandpass characteristic of the LC low pass filter appears at the end of the pass band of the filter 92 to cause such degradation. If the bandpass characteristic S02 of the filter 92 is not steep at the high pass end, the signal at the low pass side of the pass band of the filter 93 leaks into the filter 92 to degrade insertion loss at the low pass side of the pass band of the filter 93.

This indicates that the use of the series inductor for the impedance matching with the filter 92 having a pass band close to that of the filter 93, among the filters 91 and 92, has a disadvantage for good bandpass characteristic at the low pass end of the pass band of the filter 93. The bandpass characteristic of the filter 93 is more prone to be degraded as the gap between the pass band of the filter 92 and the pass band of the filter 93 is narrowed.

The inventors have found the configurations of multiplexers disclosed below based on the above consideration.

Embodiments of the present disclosure will herein be described in detail using an example with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure.

First Embodiment

Figure 6:
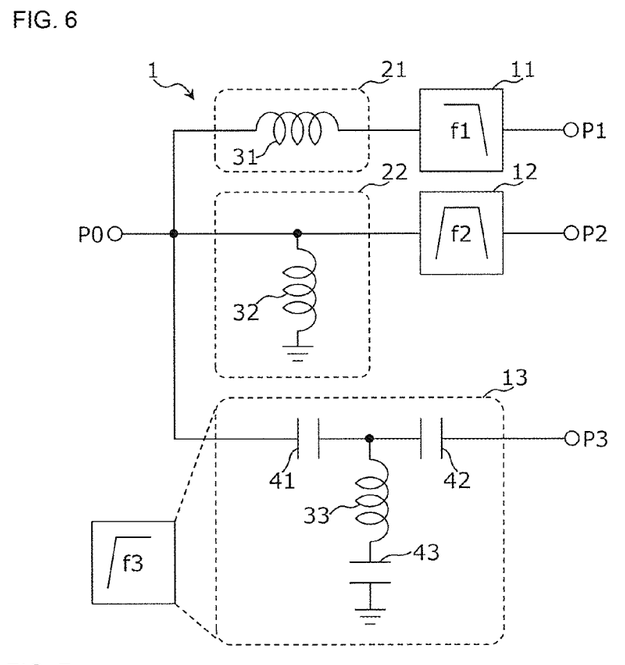
FIG. 6 is a functional block diagram illustrating an example of the configuration of a triplexer according to a first embodiment.

FIG. 6 is a functional block diagram illustrating an example of the configuration of a triplexer according to a first embodiment. As illustrated in FIG. 6, a triplexer 1 has a common terminal P0, a first terminal P1, a second terminal P2, a third terminal P3, a first filter 11, a second filter 12, a third filter 13, a first matching circuit 21, and a second matching circuit 22.

One end of the first matching circuit 21 is connected to the common terminal P0. The first matching circuit 21 includes a first inductor 31. The first inductor 31 is connected on a first signal path connecting one end of the first matching circuit 21 to the other end thereof to compose part of the first signal path. The first signal path corresponds to a portion in the first matching circuit 21, in the signal path connecting the common terminal P0 to the first terminal P1.

One end of the first filter 11 is connected to the other end of the first matching circuit 21 and the other end of the first filter 11 is connected to the first terminal P1. The first filter 11 has a first pass band f1. The first filter 11 may be, for example, a SAW filter.

One end of the second matching circuit 22 is connected to the common terminal P0. The second matching circuit 22 includes a second inductor 32. The second inductor 32 is connected between a second signal path connecting one end of the second matching circuit 22 to the other end thereof and the ground. The second signal path corresponds to a portion in the second matching circuit 22, in the signal path connecting the common terminal P0 to the second terminal P2.

One end of the second filter 12 is connected to the other end of the second matching circuit 22 and the other end of the second filter 12 is connected to the second terminal P2. The second filter 12 has a second pass band f2 the low pass end of which is higher than the high pass end of the first pass band f1. The second filter 12 may be, for example, a SAW filter.

One end of the third filter 13 is connected to the common terminal P0 and the other end of the third filter 13 is connected to the third terminal P3. The third filter 13 has a third pass band f3 the low pass end of which is higher than the high pass end of the second pass band f2. The third filter 13 may be, for example, an LC high pass filter composed of a third inductor 33 and capacitors 41, 42, and 43.

The bandpass characteristics of the first filter 11, the second filter 12, and the third filter 13 in the triplexer 1 will now be described, in contrast with the triplexer 9a according to a comparative example illustrated in FIG. 2. In the triplexer 9a according to the comparative example, the filters 91, 92, and 93 are referred to as a first filter 91, a second filter 92, and a third filter 93, respectively.

Figure 7:
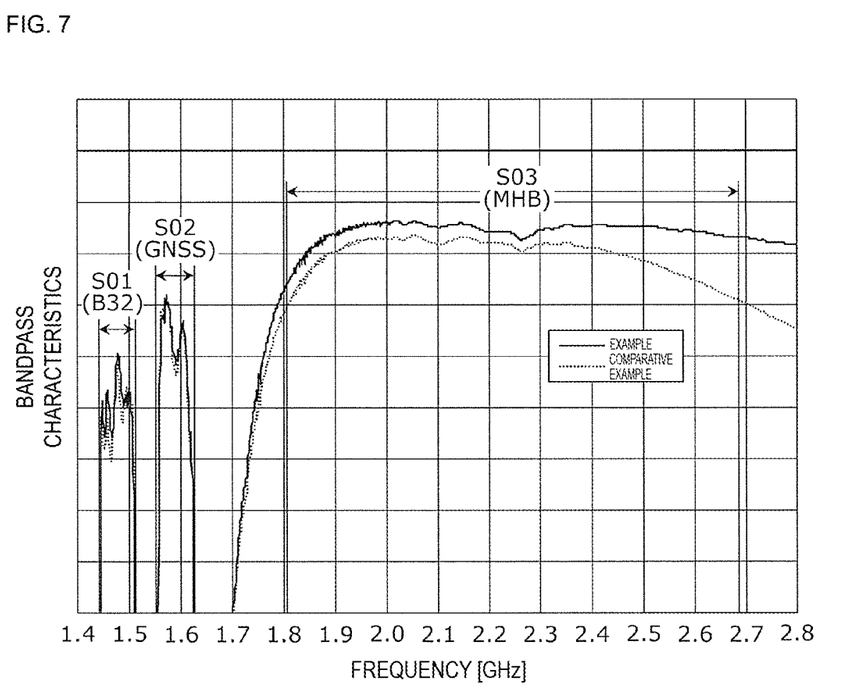
FIG. 7 is a graph indicating an example of the bandpass characteristics of the triplexer according to the first embodiment.

FIG. 7 is a graph indicating an example of the bandpass characteristics of the triplexers 1 and 9a. Referring to FIG. 7, the bandpass characteristics of the triplexer 1 according to the example are indicated by solid lines, and the bandpass characteristics of the triplexer 9a according to the comparative example are indicated by dotted lines. The following frequency bands are assumed as the pass bands of the respective filters in the triplexers 1 and 9a in the example in FIG. 7.

The first pass band of the first filters 11 and 91 is a frequency band of Band 32 in a Long Term Evolution (LTE) standard of a mobile phone.

The second pass band of the second filters 12 and 92 is a frequency band used in Global Navigation Satellite System (GNSS).

The third pass band of the third filters 13 and 93 is a frequency band from about 1,710 MHz to about 2,690 MHz, which is a middle-high band in the LTE standard.

In the triplexer 1, the impedance matching of the first filter 11, which has the first pass band f1 apart from the third pass band f3 of the third filter 13 at the low pass side, among the first filter 11 and the second filter 12, is achieved by the first inductor 31, which is a series inductor. Accordingly, the leakage of the signal at the high pass side of the pass band of the third filter 13 into the first filter 11 is inhibited by the first inductor 31 to enable the insertion loss at the high pass side of the pass band of the third filter 13 to be suppressed, compared with that in the comparative example.

In addition, the impedance matching of the second filter 12, which has the second pass band f2 close to the third pass band f3 of the third filter 13, among the first filter 11 and the second filter 12, is achieved by the second inductor 32, which is a shunt inductor. Accordingly, the steepness at the low pass end of the third pass band f3 of the third filter 13 is capable of being improved, compared with that in the comparative example, as illustrated in FIG. 7.

Since the effect of suppressing the insertion loss of the third filter 13 is more effectively achieved in a higher bandpass characteristic, the frequency range in which the insertion loss of the third filter 13 is suppressed is widened as the third filter 13 has a wider third pass band f3. Accordingly, the width of the third pass band may be greater than the width of the first pass band and the width of the second pass band. The width of the third pass band may be greater than the sum of the width of the first pass band and the width of the second pass band.

With the above configuration, since the effect of suppressing the insertion loss of the third filter 13 is more effectively achieved, the bandpass characteristics of the triplexer 1 are more greatly improved.

The inductance value of the first inductor 31 may be lower than the inductance value of the second inductor 32.

The inductor having a lower inductance value generally has lower loss. Accordingly, the use of the first inductor 31 having an inductance value lower than that of the second inductor 32, which is a shunt inductor, as the series inductor enables the insertion loss to be reduced to realize the triplexer 1 having excellent bandpass characteristics.

The first pass band, the second pass band, and the third pass band indicated in FIG. 7 are not limited to the above ones. The frequency bands in which the second pass band is at the high pass side of the first pass band and the third pass band is at the high pass side of the second pass band are capable of being used as the first pass band, the second pass band, and the third pass band. For example, the following frequency bands may be used, instead of the frequency bands illustrated in FIG. 7.

The first pass band may be a frequency band from about 1,427.9 MHz to about 1,510.9 MHz, which is a middle-low band in the LTE standard, or part of the frequency band, the second pass band may be a frequency band used in the GNSS or part of the frequency band, and the third pass band may be a frequency band from about 1,710 MHz to about 2,690 MHz, which is the middle-high band in the LTE standard, or part of the frequency band.

With the above configuration, it is possible to realize the multiplexer that supports both the GNSS and the LTE and that has excellent bandpass characteristics.

The first pass band may be a frequency band from about 1,427.9 MHz to about 1,510.9 MHz, which is the middle-low band in the LTE standard, or part of the frequency band, the second pass band may be a frequency band from about 1,710 MHz to about 2,200 MHz, which is a middle band in the LTE standard, or part of the frequency band, and the third pass band may be a frequency band from about 2,300 MHz to about 2,690 MHz, which is a high band in the LTE standard, or part of the frequency band.

With the above configuration, it is possible to realize the multiplexer that supports carrier aggregation in which multiple communication bands in the LTE are concurrently used for communication and that has excellent bandpass characteristics.

The first pass band may be a frequency band from about 1,710 MHz to about 2,200 MHz, which is the middle band in the LTE standard, or part of the frequency band, the second pass band may be a frequency band of Band 30 or Band 40 in the LTE standard, and the third pass band may be a frequency band of Band 7, Band 38, or Band 41 in the LTE standard.

With the above configuration, it is possible to realize the multiplexer that supports the carrier aggregation in which the multiple communication bands in the LTE are concurrently used for communication and that has excellent bandpass characteristics.

The first pass band may be a frequency band used in the GNSS or part of the frequency band, the second pass band may be a frequency band from about 1,710 MHz to about 2,200 MHz, which is the middle band in the LTE standard, or part of the frequency band, and the third pass band may be a frequency band used in a radio network conforming to a 2.4 GHz Wi-Fi (registered trademark) standard.

With the above configuration, it is possible to realize the multiplexer that supports all the GNSS, the LTE, and the Wi-Fi and that has excellent bandpass characteristics.

The multiplexers having good bandpass characteristics in various applications are realized depending on the above combinations of the frequency bands.

The bandpass characteristics of the triplexer 1 is capable of being improved based on the structure of the first filter 11.

Figure 8:
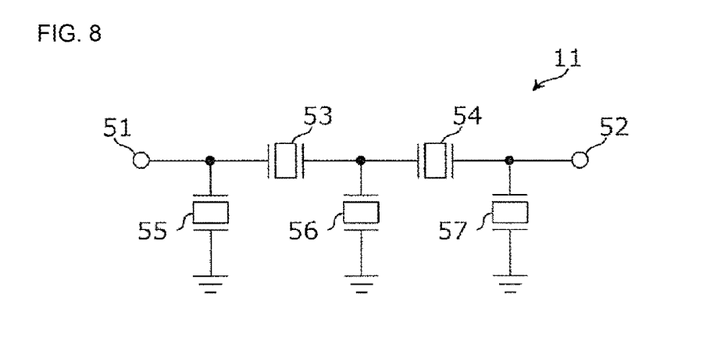
FIG. 8 is a functional block diagram illustrating an example of the configuration of a first filter according to the first embodiment.

FIG. 8 is a functional block diagram illustrating an example of the configuration of the first filter 11. As illustrated in FIG. 8, the first filter 11 may be composed of series arm resonators 53 and 54 and parallel arm resonators 55, 56, and 57.

The series arm resonators 53 and 54 are provided on a third signal path connecting one end 51 of the first filter 11 to the other end 52 of the first filter 11, and each of the parallel arm resonators 55, 56, and 57 is provided on a path connecting the third signal path to the ground. The third signal path corresponds to a portion in the first filter 11, in the signal path connecting the common terminal P0 to the first terminal P1. Among the resonators 53 to 57, the resonator closest to the one end 51 of the first filter 11 is the parallel arm resonator 55.

With the above configuration, since the cutoff characteristics of the LC low pass filter composed of the first inductor 31 and the first filter 11 are made better, it is easier to improve the bandpass characteristics of the triplexer 1.

Second Embodiment

Some modifications of the triplexer 1 described in the first embodiment will be described in a second embodiment.

Figure 9:
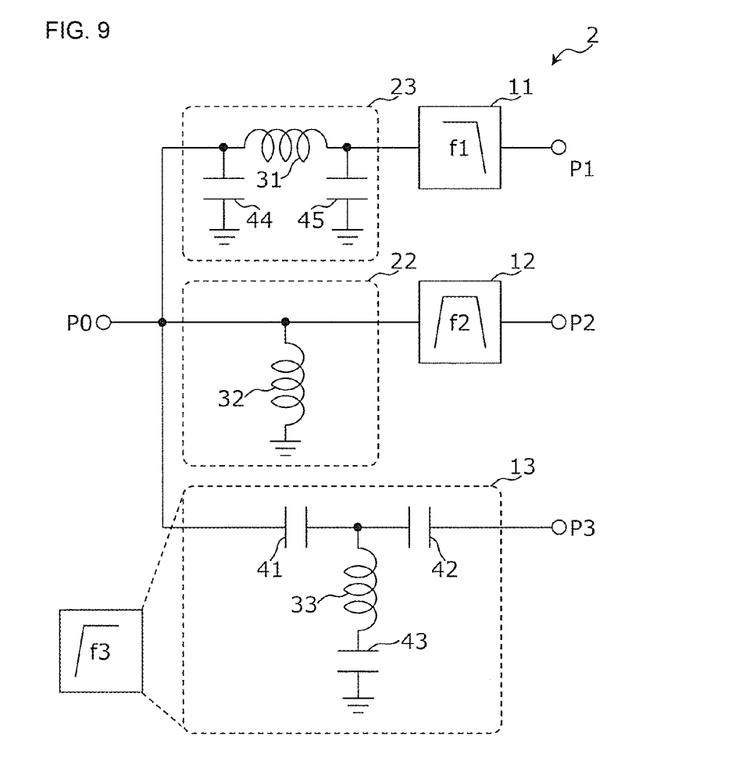
FIG. 9 is a functional block diagram illustrating an example of the configuration of a triplexer according to a second embodiment.

FIG. 9 is a functional block diagram illustrating an example of the configuration of a triplexer according to the second embodiment. A triplexer 2 illustrated in FIG. 9 is configured by replacing the first matching circuit 21 in the triplexer 1 in FIG. 6 with a first matching circuit 23.

The first matching circuit 23 differs from the first matching circuit 21 in that first capacitors 44 and 45 are added. The first capacitors 44 and 45 are connected between the first signal path connecting one end of the first matching circuit 23 to the other end thereof and the ground. In other words, the first matching circuit 23 in the second embodiment is composed of the first inductor 31, the first capacitor 44 connected between one end of the first inductor 31 and the ground, and the first capacitor 45 connected between the other end of the first inductor 31 and the ground.

With the first matching circuit 23, a low pass filter having better cutoff characteristics is capable of being formed, compared with a low pass filter composed of the first inductor 31 and a parasitic capacitance of the first filter 11 when the first matching circuit 21 is used. Accordingly, it is easier to improve the bandpass characteristics of the triplexer 2.

Figure 10:
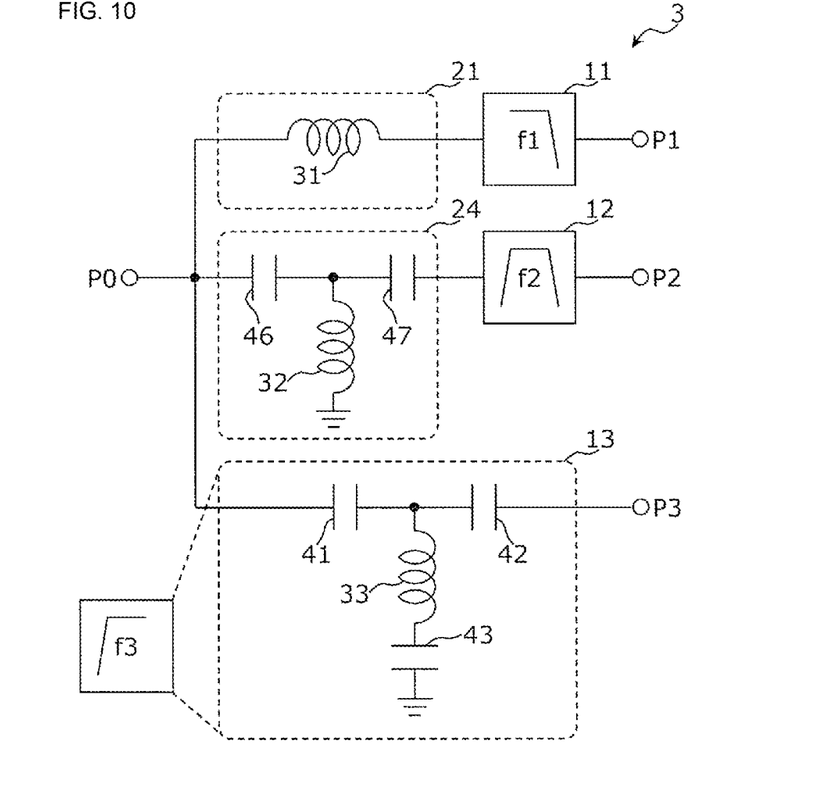
FIG. 10 is a functional block diagram illustrating another example of the configuration of a triplexer according to the second embodiment.

FIG. 10 is a functional block diagram illustrating another example of the configuration of a triplexer according to the second embodiment. A triplexer 3 illustrated in FIG. 10 is configured by replacing the second matching circuit 22 in the triplexer 1 in FIG. 6 with a second matching circuit 24.

The second matching circuit 24 differs from the second matching circuit 22 in that second capacitors 46 and 47 are added. The second capacitors 46 and 47 are connected to the second signal path connecting one end of the second matching circuit 24 to the other end thereof. In other words, the second matching circuit 24 in the second embodiment is composed of the second inductor 32, the second capacitor 46 connected between one end of the second matching circuit 24 and a node to which the second inductor 32 is connected on the second signal path, and the second capacitor 47 connected between the other end of the second matching circuit 24 and the node to which the second inductor 32 is connected on the second signal path.

With the second matching circuit 24, since the impedance of the second filter 12 is capable of being adjusted in a wider range, it is easier to improve the bandpass characteristics of the triplexer 3.

Figure 11:
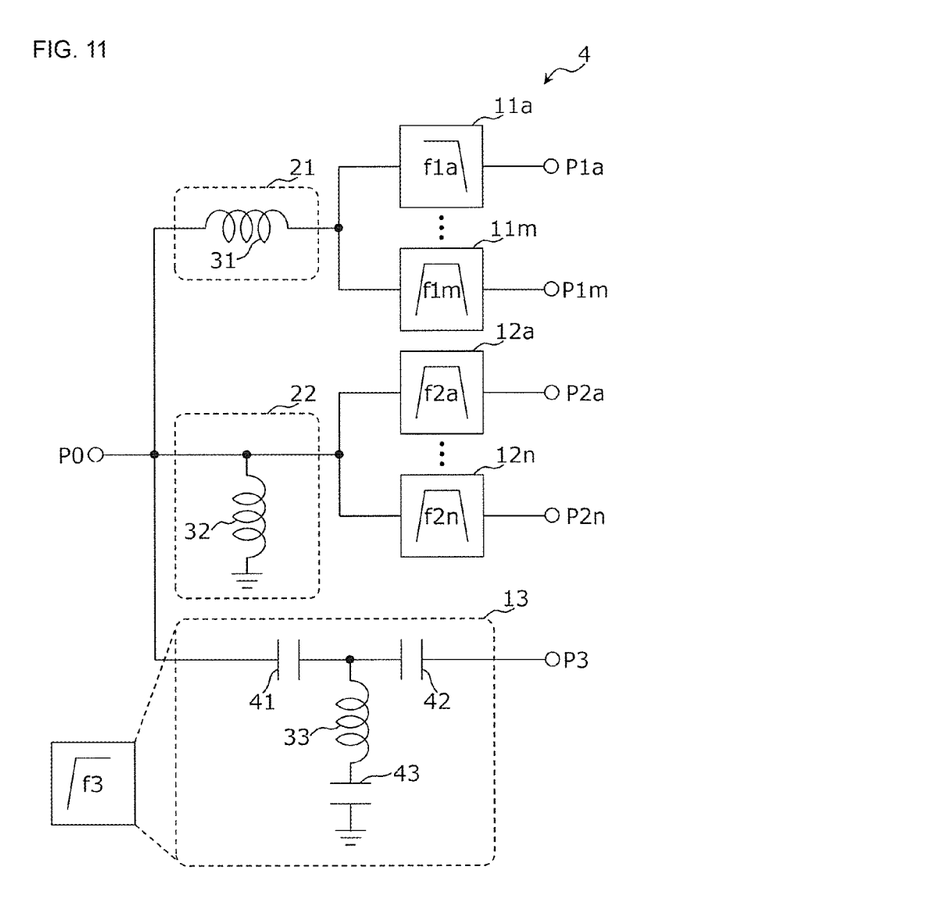
FIG. 11 is a functional block diagram illustrating an example of the configuration of a multiplexer according to the second embodiment.

FIG. 11 is a functional block diagram illustrating an example of the configuration of a multiplexer according to the second embodiment. A multiplexer 4 illustrated in FIG. 11 differs from the triplexer 1 in FIG. 6 in that the multiplexer 4 includes multiple first filters 11*a* to 11*m*, multiple first terminals P1*a* to P1*m*, multiple second filters 12*a* to 12*n*, and multiple second terminals P2*a* to P2*n*.

The first filters 11*a* to 11*m* may be filters having different configurations or may be filters having different pass bands. The second filters 12*a* to 12*n* may be filters having different configurations or may be filters having different pass bands.

When the fact that a pass band fA is at the high pass side of a pass band fB is denoted by fB<fA using an inequality sign, pass bands f1*a* to f1*m* of the first filters 11*a* to 11*m* are denoted by f1*a*< . . . <f1*m*, pass bands f2*a* to f2*n* of the second filters 12*a* to 12*n* are denoted by f1*m*<f2*a*< . . . <f2*n*, and the third pass band f3 of the third filter 13 is denoted by f2*n*<f3.

The total number of the second filters 12*a* to 12*n* may be smaller than the total number of the first filters 11*a* to 11*m*. In other words, the total number of the second filters 12*a* to 12*n* connected to the second inductor 32, which is a shunt inductor, may be made smaller than the total number of the first filters 11*a* to 11*m* connected to the first inductor 31, which is a series inductor.

Leakage of a radio-frequency (RF) signal from the third filter 13 to the first filters 11*a* to 11*m* is inhibited by the first inductor 31, which is a series inductor. In contrast, leakage of the RF signal from the third filter 13 to the second filters 12*a* to 12*n* is not inhibited by the second inductor 32, which is a shunt inductor.

Accordingly, the total number of the second filters 12*a* to 12*n* the leakage of the RF signal from the third filter 13 to which is not inhibited is made smaller than the total number of the first filters 11*a* to 11*m* the leakage of the RF signal from the third filter 13 to which is inhibited.

Since this decreases the number of filters into which the RF signal may leak from the third filter 13, the bandpass characteristics of the multiplexer 4 is made better.

With the above configuration, it is possible to realize the multiplexer 4 that is capable of demultiplexing and multiplexing four or more signals and that has excellent bandpass characteristics.

Third Embodiment

A communication apparatus using any of the triplexers 1 to 3 and the multiplexer 4 described in the first and second embodiments will be described in a third embodiment.

Figure 12:
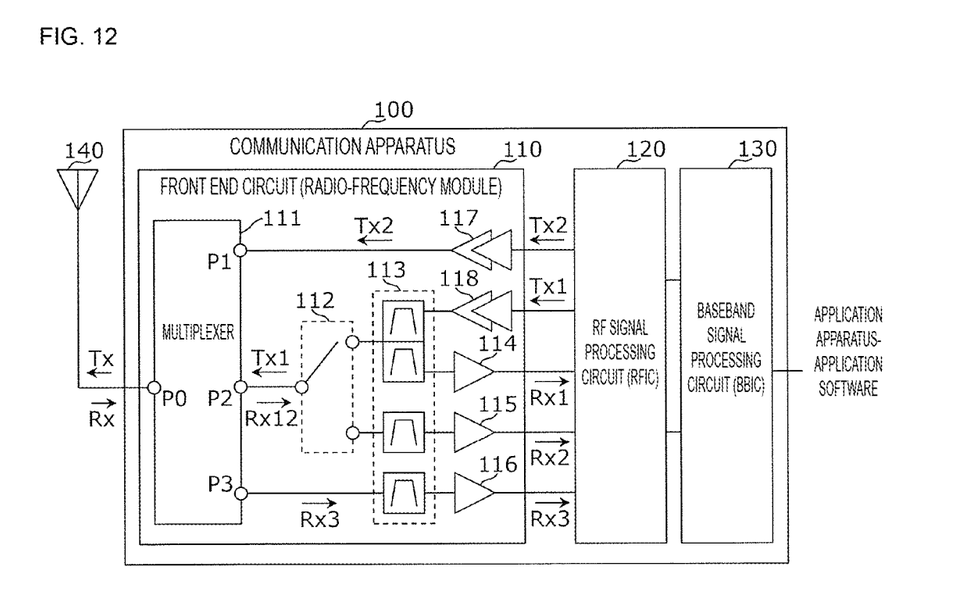
FIG. 12 is a block diagram illustrating an example of the functional configuration of a communication apparatus according to a third embodiment.

FIG. 12 is a block diagram illustrating an example of the functional configuration of a communication apparatus according to the third embodiment. As illustrated in FIG. 12, a communication apparatus 100 includes a front end circuit 110, an RF signal processing circuit 120, and a baseband signal processing circuit 130. Symbols having arrows added thereto represent signals to be transmitted in FIG. 12.

The front end circuit 110 includes a multiplexer 111, a switch 112, a filter group 113, low noise amplifiers 114, 115, and 116, and power amplifiers 117 and 118. The front end circuit 110 supports multiband communication in which multiple frequency bands are selectively used for communication.

A reception RF signal Rx received by an antenna element 140 is demultiplexed into reception signals Rx12 and Rx3 in the multiplexer 111. The reception signal Rx12 is further demultiplexed into reception signals Rx1 and Rx2 in the switch 112 and the filter group 113. The low noise amplifiers 114, 115, and 116 amplify the reception signals Rx1, Rx2, and Rx3 for the respective communication bands, respectively, and supply the reception signals Rx1, Rx2, and Rx3 to the RF signal processing circuit 120.

The power amplifiers 117 and 118 amplify transmission signals Tx1 and Tx2 for the respective communication bands, respectively, which are supplied from the RF signal processing circuit 120, and supply the transmission signals Tx1 and Tx2 to the multiplexer 111. The transmission signal Tx1 is supplied to the multiplexer 111 via the filter group 113 and the switch 112. The transmission signals Tx1 and Tx2 for the respective communication bands are multiplexed into a transmission RF signal Tx in the multiplexer 111. The transmission RF signal Tx is transmitted from the antenna element 140.

Any of the triplexers 1 to 3 and the multiplexer 4 described above in the first and second embodiments is used for the multiplexer 111. The front end circuit 110 may be composed of a radio-frequency module.

The RF signal processing circuit 120 converts the reception RF signals Rx1, Rx2, and Rx3 for the respective communication bands, which are received from the front end circuit 110, into a baseband reception signal and supplies the baseband reception signal to the baseband signal processing circuit 130. The conversion may include demodulation of the signals and down-conversion. In addition, the RF signal processing circuit 120 converts a baseband transmission signal generated in the baseband signal processing circuit 130 into the transmission RF signals Tx1 and Tx2 for the respective communication bands and supplies the transmission RF signals Tx1 and Tx2 to the front end circuit 110. The conversion may include modulation of the signals and up-conversion. The RF signal processing circuit 120 may be composed of a radio-frequency integrated circuit (RFIC) chip.

The baseband signal processing circuit 130 converts the reception signal received from the RF signal processing circuit 120 into reception data and supplies the reception data to an application apparatus-application software. The conversion may include decompression of the data, demultiplexing, and error correction. In addition, the baseband signal processing circuit 130 converts transmission data generated in the application apparatus-application software into the transmission signal and supplies the transmission signal to the RF signal processing circuit 120. The conversion may include compression of data, multiplexing, and addition of an error correction code. The baseband signal processing circuit 130 may be composed of a baseband integrated circuit (BBIC) chip.

The application apparatus-application software performs application operations, such as voice call and image display, using the transmission data and the reception data.

Although the triplexer is used as the multiplexer 111 in FIG. 12, the multiplexer 111 is not limited to this example. The multiplexer 111 may be a multiplexer capable of demultiplexing and multiplexing four or more signals.

With the communication apparatus 100 having the above configuration, it is possible to realize the high-performance communication apparatus by using the multiplexer 111 having excellent bandpass characteristics.

Although the multiplexers and the communication apparatus according to the aspects of the present disclosure are described above based on the embodiments, the present disclosure is not limited to the individual embodiments. Modifications realized by making various changes conceivable by a person skilled in the art to the above embodiments without departing from the spirit and scope of the present disclosure and modes realized by combining the components in different embodiments may be included in the range of one or multiple aspects of the present disclosure.

SUMMARY

As described above, a multiplexer according to an embodiment of the present disclosure includes a common terminal; a first terminal; a second terminal; a third terminal; a first matching circuit having a first end connected to the common terminal; a first filter that has a first end connected to a second end of the first matching circuit and a second end connected to the first terminal and that has a first pass band; a second matching circuit having a first end connected to the common terminal; a second filter that has a first end connected to a second end of the second matching circuit and a second end connected to the second terminal and that has a second pass band a low pass end of which is higher than a high pass end of the first pass band; and a third filter that has a first end connected to the common terminal and a second end connected to the third terminal and that has a third pass band a low pass end of which is higher than a high pass end of the second pass band. The first matching circuit includes a first inductor connected on a first signal path connecting the first end of the first matching circuit to the second end thereof. The second matching circuit includes a second inductor connected between a second signal path connecting the first end of the second matching circuit to the second end thereof and ground.

With the above configuration, the impedance matching of the first filter, which has the first pass band apart from the third pass band of the third filter at the low pass side, among the first filter and the second filter, is achieved by the first inductor. The first inductor is a so-called series inductor that is connected on the first signal path connecting the input-output terminals of the first matching circuit and that composes part of the first signal path. Accordingly, leakage of the signal at the high pass side of the pass band of the third filter into the first filter is inhibited by the first inductor to suppress the insertion loss at the high pass side of the pass band of the third filter.

In addition, the impedance matching of the second filter, which has the second pass band close to the third pass band of the third filter, among the first filter and the second filter, is achieved by the second inductor. The second inductor is a so-called shunt inductor connected between the second signal path connecting the input-output terminals of the second matching circuit and the reference potential (for example, the ground). Accordingly, since the bandpass characteristic of the LC low pass filter, which is prone to be degraded in the steepness, does not appear at the high pass end of the pass band of the second filter, leakage of the signal at the low pass side of the pass band of the third filter into the second filter is suppressed to improve the steepness at the low pass end of the third pass band of the third filter.

Consequently, it is possible to realize the multiplexer having excellent bandpass characteristics.

The first filter and the second filter may be acoustic wave filters. A width of the third pass band may be wider than a width of the first pass band and a width of the second pass band.

A width of the third pass band may be wider than a sum of a width of the first pass band and a width of the second pass band.

With the above configuration, since the effect of suppressing the insertion loss of the third filter is more effectively achieved in a higher bandpass characteristic, it is possible to realize the multiplexer capable of more greatly improving the bandpass characteristics.

An inductance value of the first inductor may be lower than an inductance value of the second inductor.

With the above configuration, the inductor having a lower inductance value generally has lower loss. Accordingly, since the first inductor having an inductance value lower than that of the second inductor, which is a shunt inductor, is used as the series inductor, the insertion loss is capable of being reduced to realize the multiplexer having excellent bandpass characteristics.

The first matching circuit may further include a first capacitor connected between the first signal path and the ground.

With the above configuration, since the cutoff characteristics of the low pass filter composed of the first matching circuit and a parasitic component of the first filter are made better, it is easier to improve the bandpass characteristics.

The second matching circuit may further include a second capacitor connected to the second signal path.

With the above configuration, since the impedance of the second filter is capable of being adjusted in a wider range, it is easier to improve the bandpass characteristics.

The first filter may include at least one series arm resonator provided on a third signal path connecting the first end of the first filter and the second end thereof and at least one parallel arm resonator provided on a path connecting the third signal path to the ground. The resonator closest to the first end of the first filter may be any parallel arm resonator in the at least one parallel arm resonator.

With the above configuration, since the cutoff characteristics of the low pass filter composed of the first matching circuit and the parasitic component of the first filter are made better, it is easier to improve the bandpass characteristics.

The multiplexer may include multiple first terminals, multiple second terminals, multiple first filters, and multiple second filters. The second end of each of the multiple first filters may be connected to the corresponding first terminal. The second end of each of the multiple second filters may be connected to the corresponding second terminal. The first pass bands of the respective multiple first filters may be different pass bands. The second pass bands of the respective multiple second filters may be different pass bands. A total number of the multiple second filters may be smaller than a total number of the multiple first filters.

With the above configuration, leakage of the RF signal from the third filter to the multiple first filters is inhibited by the first inductor, which is a series inductor. In contrast, leakage of the RF signal from the third filter to the multiple second filters is not inhibited by the second inductor, which is a shunt inductor. Accordingly, the total number of the second filters the leakage of the RF signal from the third filter into which is not inhibited is made smaller than the total number of the first filters the leakage of the RF signal from the third filter into which is inhibited. Since this decreases the number of filters into which the RF signal may leak from the third filter, the bandpass characteristics of the multiplexer is made better.

The first pass band may be a frequency band from about 1,427.9 MHz to about 1,510.9 MHz, which is a middle-low band in a Long Term Evolution (LTE) standard of a mobile phone, or part of the frequency band. The second pass band may be a frequency band used in Global Navigation Satellite System (GNSS) or part of the frequency band. The third pass band may be a frequency band from about 1,710 MHz to about 2,690 MHz, which is a middle-high band in the LTE standard, or part of the frequency band.

With the above configuration, it is possible to realize the multiplexer that supports both the GNSS and the LTE and that has excellent bandpass characteristics.

The first pass band may be a frequency band from about 1,427.9 MHz to about 1,510.9 MHz, which is the middle-low band in the Long Term Evolution (LTE) standard of a mobile phone, or part of the frequency band. The second pass band may be a frequency band from about 1,710 MHz to about 2,200 MHz, which is a middle band in the LTE standard, or part of the frequency band. The third pass band may be a frequency band from about 2,300 MHz to about 2,690 MHz, which is a high band in the LTE standard, or part of the frequency band.

With the above configuration, it is possible to realize the multiplexer that supports the carrier aggregation in which the multiple communication bands in the LTE are concurrently used for communication and that has excellent bandpass characteristics.

The first pass band may be a frequency band from about 1,710 MHz to about 2,200 MHz, which is the middle band in the Long Term Evolution (LTE) standard of a mobile phone, or part of the frequency band. The second pass band may be a frequency band of Band 30 or Band 40 in the LTE standard. The third pass band may be a frequency band of Band 7, Band 38, or Band 41 in the LTE standard.

With the above configuration, it is possible to realize the multiplexer that supports the carrier aggregation in which the multiple communication bands in the LTE are concurrently used for communication and that has excellent bandpass characteristics.

The first pass band may be a frequency band used in Global Navigation Satellite System (GNSS) or part of the frequency band. The second pass band may be a frequency band from about 1,710 MHz to about 2,200 MHz, which is the middle band in the Long Term Evolution (LTE) standard of a mobile phone, or part of the frequency band. The third pass band may be a frequency band used in a radio network conforming to a 2.4 GHz Wi-Fi (registered trademark) standard.

With the above configuration, it is possible to realize the multiplexer that supports all the GNSS, the LTE, and the Wi-Fi and that has excellent bandpass characteristics.

A communication apparatus according to an embodiment of the present disclosure includes the multiplexer.

With the above configuration, it is possible to realize the high-performance communication apparatus by using the multiplexer having excellent bandpass characteristics.

The present disclosure is widely usable for a communication device, such as a mobile phone, as the multiplexer having excellent bandpass characteristics.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A multiplexer comprising:
    a common terminal;
    a first terminal;
    a second terminal;
    a third terminal;
    a first matching circuit having a first end connected to the common terminal;
    a first filter that has a first end connected to a second end of the first matching circuit and a second end connected to the first terminal and that has a first pass band;
    a second matching circuit having a first end connected to the common terminal;
    a second filter that has a first end connected to a second end of the second matching circuit and a second end connected to the second terminal and that has a second pass band a low pass end of which is higher than a high pass end of the first pass band; and
    a third filter that has a first end connected to the common terminal and a second end connected to the third terminal and that has a third pass band a low pass end of which is higher than a high pass end of the second pass band,
    wherein the first matching circuit includes a first inductor connected on a first signal path connecting the first end of the first matching circuit to the second end thereof, the first inductor is not connected between the first signal path and ground,
    wherein the second matching circuit includes a second inductor connected between a second signal path connecting the first end of the second matching circuit to the second end thereof and the ground, and
    wherein a width of the third pass band is wider than a width of the first pass band and a width of the second pass band,
    wherein the number of matching circuits between the filters and the common terminal is less than the number of filters, and
    wherein the first end of the first matching circuit and the first end of the second matching circuit are each directly connected to a node that is connected to the common terminal.

2. The multiplexer according to claim 1,
    wherein the third filter includes a third inductor and a fifth capacitor.

3. The multiplexer according to claim 2,
    wherein the fifth capacitor is connected between the common terminal and the third inductor.

4. The multiplexer according to claim 3,
    wherein the third filter further includes a sixth capacitor connected between the third terminal and the third inductor.

5. The multiplexer according to claim 4,
    wherein the third filter further includes a seventh capacitor connected between the third inductor and the ground.

6. The multiplexer according to claim 2,
    wherein the third inductor is connected between a fourth signal path connecting the common terminal and the third terminal and the ground.

7. The multiplexer according to claim 1,
    wherein the first matching circuit further includes a first capacitor connected between the first signal path and the ground.

8. The multiplexer according to claim 7,
    wherein the first matching circuit further includes a second capacitor connected between the first signal path and the ground,
    wherein the first capacitor is connected between the first end of the first matching circuit and a first end of the first inductor, and the second capacitor is connected between the second end of the first matching circuit and a second end of the first inductor.

9. The multiplexer according to claim 1,
    wherein the second matching circuit further includes a third capacitor connected to the second signal path.

10. The multiplexer according to claim 9,
    wherein the second matching circuit further includes a fourth capacitor connected to the second signal path,
    wherein the third capacitor is connected between the first end of the second matching circuit and the second inductor, and the fourth capacitor is connected between the second end of the second matching circuit and the second inductor.

11. The multiplexer according to claim 1,
    wherein the first filter and the second filter are acoustic wave filters.

12. The multiplexer according to claim 1,
    wherein a width of the third pass band is wider than a sum of a width of the first pass band and a width of the second pass band.

13. The multiplexer according to claim 1,
    wherein an inductance value of the first inductor is lower than an inductance value of the second inductor.

14. The multiplexer according to claim 1,
    wherein the first filter includes
        at least one series arm resonator provided on a third signal path connecting the first end of the first filter and the second end thereof, and
        at least one parallel arm resonator provided on a path connecting the third signal path to the ground, and
    wherein the resonator closest to the first end of the first filter is any parallel arm resonator in the at least one parallel arm resonator.

15. The multiplexer according to claim 1,
    wherein the multiplexer includes a plurality of first terminals, a plurality of second terminals, a plurality of first filters, and a plurality of second filters,
    wherein the second end of each of the plurality of first filters is connected to a corresponding first terminal,
    wherein the second end of each of the plurality of second filters is connected to a corresponding second terminal, wherein the first pass bands of the respective plurality of first filters are different first pass bands, wherein the second pass bands of the respective plurality of second filters are different second pass bands, and wherein a total number of the plurality of second filters is smaller than a total number of the plurality of first filters.

16. The multiplexer according to claim 1, wherein the first pass band is a frequency band from about 1,427.9 MHz to about 1,510.9 MHz, which is a middle-low band in a Long Term Evolution (LTE) standard of a mobile phone, or part of the frequency band from about 1,427.9 MHz to about 1,510.9 MHz, wherein the second pass band is a frequency band used in Global Navigation Satellite System (GNSS) or part of the GNSS frequency band, and wherein the third pass band is a frequency band from about 1,710 MHz to about 2,690 MHz, which is a middle-high band in the LTE standard, or part of the frequency band from about 1,710 MHz to about 2,690 MHz.

17. The multiplexer according to claim 1, wherein the first pass band includes a frequency band from about 1,427.9 MHz to about 1,510.9 MHz, which is a middle-low band in a Long Term Evolution (LTE) standard of a mobile phone, or part of the frequency band from about 1,427.9 MHz to about 1,510.9 MHz, wherein the second pass band includes a part of a frequency band from about 1,710 MHz to about 2,200 MHz, which is a middle band in the LTE standard, and wherein the third pass band includes a frequency band from about 2,300 MHz to about 2,690 MHz, which is a high band in the LTE standard, or part of the frequency band from about 2,300 MHz to about 2,690 MHz.

18. The multiplexer according to claim 1, wherein the first pass band includes a part of a frequency band from about 1,710 MHz to about 2,200 MHz, which is a middle band in a Long Term Evolution (LTE) standard of a mobile phone, wherein the second pass band includes a frequency band of Band 30 or Band 40 in the LTE standard, and wherein the third pass band includes a frequency band of Band 7, Band 38, or Band 41 in the LTE standard.

19. The multiplexer according to claim 1, wherein the first pass band includes a frequency band used in Global Navigation Satellite System (GNSS) or part of the GNSS frequency band, wherein the second pass band includes a part of a frequency band from about 1,710 MHz to about 2,200 MHz, which is a middle band in a Long Term Evolution (LTE) standard of a mobile phone, and wherein the third pass band includes a frequency band used in a radio network conforming to a 2.4 GHz Wi-Fi® standard.

20. A communication apparatus comprising:

the multiplexer according to claim 1.

21. The multiplexer according to claim 1, wherein the second inductor is not connected on the second signal path.

* * * * *